(12) United States Patent
Shibuya

(10) Patent No.: US 9,733,439 B2
(45) Date of Patent: Aug. 15, 2017

(54) OPTICAL RECEPTACLE AND OPTICAL MODULE

(71) Applicant: Enplas Corporation, Saitama (JP)

(72) Inventor: Kazutaka Shibuya, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 15/126,853

(22) PCT Filed: Feb. 26, 2015

(86) PCT No.: PCT/JP2015/055571
§ 371 (c)(1),
(2) Date: Sep. 16, 2016

(87) PCT Pub. No.: WO2015/141426
PCT Pub. Date: Sep. 24, 2015

(65) Prior Publication Data
US 2017/0097475 A1    Apr. 6, 2017

(30) Foreign Application Priority Data
Mar. 19, 2014  (JP) .................. 2014-056512

(51) Int. Cl.
*G02B 6/42*  (2006.01)

(52) U.S. Cl.
CPC ............. *G02B 6/423* (2013.01); *G02B 6/425* (2013.01); *G02B 6/4214* (2013.01); *G02B 6/4255* (2013.01)

(58) Field of Classification Search
None
See application file for complete search history.

(56) References Cited

U.S. PATENT DOCUMENTS 8,787,714 B2 *  7/2014  Morioka ............. G02B 6/4214
                                                    385/15

FOREIGN PATENT DOCUMENTS

| JP | 58-060421 | 4/1983 |
|---|---|---|
| JP | 156738/1981 | 4/1983 |
| JP | 2010-175942 A | 8/2010 |

(Continued)

OTHER PUBLICATIONS

International Search Report from International Application No. PCT/JP2015/055571 dated May 19, 2015.

*Primary Examiner* — Uyen Chau N Le
*Assistant Examiner* — Chad Smith
(74) *Attorney, Agent, or Firm* — Brundidge & Stanger, P.C.

(57) ABSTRACT

This optical receptacle comprises the following: an optical-receptacle body that is formed via injection molding; a first optical surface; a second optical surface on a first side; a first concavity that has an angled surface whereby light that has entered via the first optical surface is reflected towards the second optical surface; a gate section on a third side; a first through-hole and a second through-hole that extend in the direction of the axis of light traveling between the second optical surface and a light-transporting body; and a second concavity located between the first concavity and the third side. The part of the second concavity closest to a second side is closer to the abovementioned first side than the part of the gate section closest to the first side is. The first through-hole also opens to a first-side surface and a second-side surface of the second concavity.

2 Claims, 8 Drawing Sheets

(56) References Cited

FOREIGN PATENT DOCUMENTS

| JP | 2012-123250 A | 6/2012 |
| JP | 2013-127491 A | 6/2013 |
| JP | 2014-074795 A | 4/2014 |

* cited by examiner

OPTICAL RECEPTACLE AND OPTICAL MODULE

TECHNICAL FIELD

The present invention relates to an optical receptacle and an optical module having the optical receptacle.

BACKGROUND ART

Conventionally, in optical communications using an optical transmission member such as an optical fiber and an optical waveguide, an optical module including a light emitting element such as a surface-emitting laser (for example, VCSEL: Vertical Cavity Surface Emitting Laser) has been used. The optical module includes an optical receptacle which allows for incidence of light containing communication information emitted from light emitting element on an end surface of the optical transmission member.

For example, PTL 1 discloses an optical module including a lens array component (optical receptacle) connected to an optical cable, and a circuit board on which a light emitting-and-receiving element (photoelectric conversion device) is disposed. The lens array component is molded by injection molding with resin. The lens array component includes: a device side lens part configured to allow light emitted from the light emitting-and-receiving element to enter the inside; a fiber side lens part configured to emit light travelling through the inside toward an end portion of the optical cable; and a reflecting surface configured to reflect the light incident on the device side lens part toward the fiber side lens part. In addition, on the side surface on which the fiber side lens part of the lens array component is disposed, a pair of guide pins to be inserted to a connector part attached at an end of the optical cable are disposed. In addition, gate track parts remain at center portions of other opposite side surfaces where the guide pins are not disposed. In plan view of the lens array component, the outer periphery portion of the lens array component has a large thickness, and the center portion of the lens array component has a small thickness.

In the lens array component of the optical module disclosed in PTL 1, the center portion and the outer periphery portion have thicknesses different from each other to prevent generation of weld lines on the light path of the light traveling in the lens array component.

CITATION LIST

Patent Literature

PTL 1
Japanese Patent Application Laid-Open No. 2010-175942

SUMMARY OF INVENTION

Technical Problem

In the optical module disclosed in PTL 1, a pair of guide pins are formed in the optical receptacle (lens array component), and through holes (positioning holes) for insertion of the guide pins are formed in the connector attached at an end of the optical fiber. On the other hand, for some reasons, it is desired in some situations to form a pair of guide pins in the connector, and form through holes for insertion of the guide pins in the optical receptacle.

In the case where a pair of through holes for insertion of the guide pins are formed in the optical receptacle, however, weld lines may be formed on the light path of the light travelling in the optical receptacle even when the center portion and the outer periphery portion of the optical receptacle are set to have thicknesses different from each other as in PTL 1.

In view of this, an object of the present invention is to provide an optical receptacle in which weld lines are not formed on the light path even in the case where a pair of through holes are formed in the optical receptacle, and which can achieve appropriate optical connection between a photoelectric conversion device and an optical transmission member. In addition, another object of the present invention is to provide an optical module having the optical receptacle.

Solution to Problem

An optical receptacle of an embodiment of the present invention is formed by injection molding, and disposed between a plurality of photoelectric conversion devices arranged in line and a plurality of optical transmission members arranged in line, the optical receptacle being configured to optically connect the photoelectric conversion devices and respective end surfaces of the optical transmission members, the optical receptacle including: an optical receptacle main body made of a light transmissive resin material, and having a substantially cuboid shape with a top surface and a bottom surface opposite to each other, a first side surface and a second side surface opposite to each other and a third side surface and a fourth side surface opposite to each other; a plurality of first optical surfaces arranged on a bottom surface of the optical receptacle main body to correspond to the photoelectric conversion devices, the first optical surfaces being configured to allow light emitted from the photoelectric conversion devices to enter the optical receptacle, or emit light travelling in the optical receptacle toward the end surfaces of the photoelectric conversion devices; a plurality of second optical surfaces arranged on a first side surface of the optical receptacle main body to correspond to the optical transmission members, the second optical surfaces being configured to emit light incident on the first optical surfaces toward the end surfaces of the optical transmission members, or allow light from the optical transmission members to enter the optical receptacle; a first recess opening at a top surface of the optical receptacle main body and including an inclined surface configured to reflect light incident on the first optical surface toward the second optical surface, or reflect light incident on the second optical surface toward the first optical surface; a gate part disposed on the third side surface; a first through hole disposed between the first recess and the third side surface, and extending in a light axis direction of light advancing between the second optical surface and the end surface of the optical transmission member, the first through hole opening at the first side surface and the second side surface; a second through hole disposed between the first recess and the fourth side surface, and extending in the light axis direction of light advancing between the second optical surface and the end surface of the optical transmission member, the second through hole opening at the first side surface and the second side surface; and a second recess opening at the top surface of the optical receptacle main body, and disposed between the first recess and the third side surface. A portion closest to the second side surface in the second recess is located on the first side surface side relative to a portion closest to the first side surface in the gate part, and the first through hole opens at a surface of the second recess on the first side surface side and a surface of the second recess on the second side surface side.

An optical module of an embodiment of the present invention includes: a substrate on which the photoelectric conversion devices are arranged at constant intervals; and the above-mentioned optical receptacle disposed on the substrate.

Advantageous Effects of Invention

According to the present invention, even in the case where a pair of through holes are formed in an optical receptacle, it is possible to achieve appropriate optical connection between a plurality of photoelectric conversion devices and a plurality of optical transmission members.

DESCRIPTION OF EMBODIMENT

An embodiment of the present invention will be described below in detail with reference to the accompanying drawings.

(Configuration of Optical Module)

Figure 1:
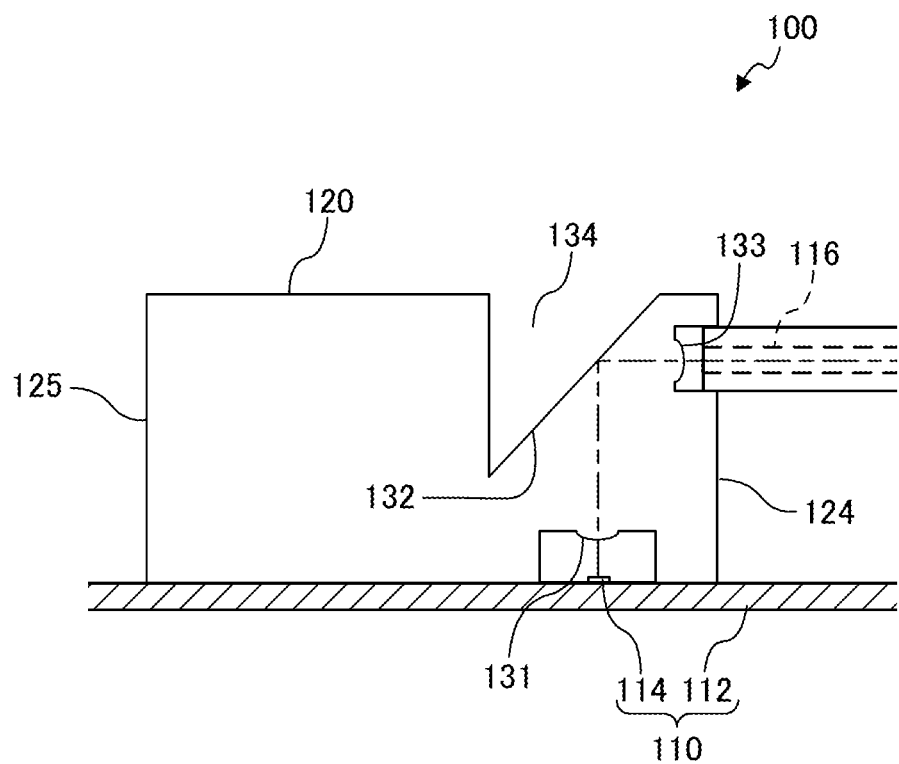
FIG. 1 is a sectional view of an optical module according to an embodiment.

FIG. 1 is a sectional view of optical module 100 according to an embodiment of the present invention. In FIG. 1, hatching of the cross-section of optical receptacle 120 is omitted to illustrate the light path in optical receptacle 120.

As illustrated in FIG. 1, optical module 100 includes photoelectric conversion device 110 of a substrate mounting type including light emitting element (photoelectric conversion device) 114, and optical receptacle 120. When optical module 100 is used, a plurality of optical transmission members 116 are connected with optical receptacle 120. The type of optical transmission member 116 is not limited, and optical transmission member 116 may be an optical fiber, an optical waveguide or the like. In the present embodiment, optical transmission members 116 are a plurality of optical fibers arranged in one line at constant intervals. The optical fiber may be of a single mode type, or a multiple mode type. It is to be noted that optical transmission member 116 may be arranged in two or more lines.

Photoelectric conversion device 110 includes substrate 112 and a plurality of light emitting elements 114. In the present embodiment, light emitting elements 114 are arranged in one line at constant intervals on substrate 112, and configured to emit laser light in a direction perpendicular to the surface of substrate 112. Light emitting element 114 is, for example, a vertical cavity surface emitting laser (VCSEL). It is to be noted that, when optical transmission members 116 are arranged in two or more lines, the number of the lines of light emitting elements 114 is identical to that of optical transmission members 116.

In the state where optical receptacle 120 is disposed between photoelectric conversion device 110 and optical transmission member 116, optical receptacle 120 optically connects light emitting elements 114 and respective end surfaces of optical transmission members 116. The configuration of optical receptacle 120 is described in detail below.

(Configuration of Optical Receptacle)

Figure 2:
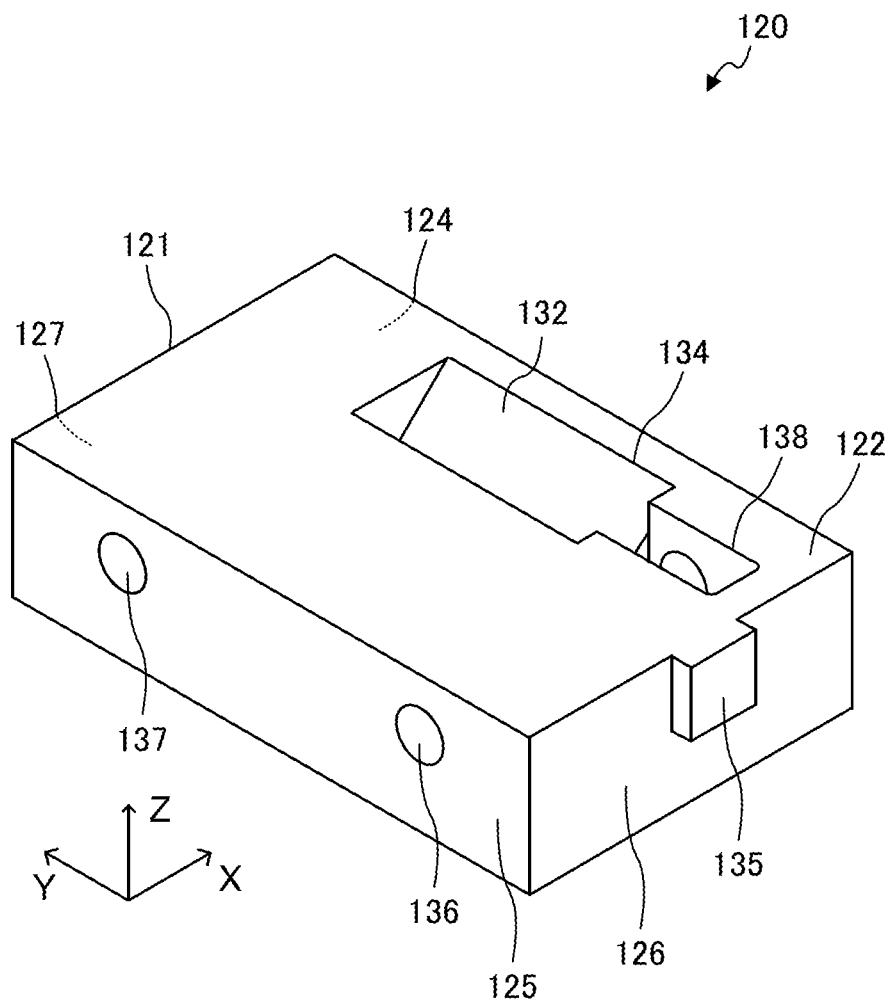
FIG. 2 is a perspective view of an optical receptacle according to the embodiment.
Figure 3A:
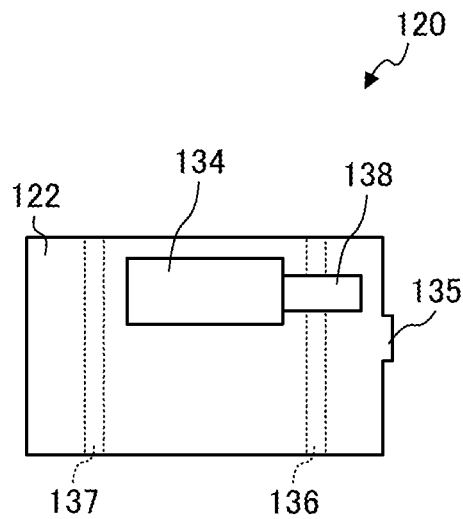
FIG. 3A to FIG. 3D illustrate a configuration of the optical receptacle.
Figure 3B:
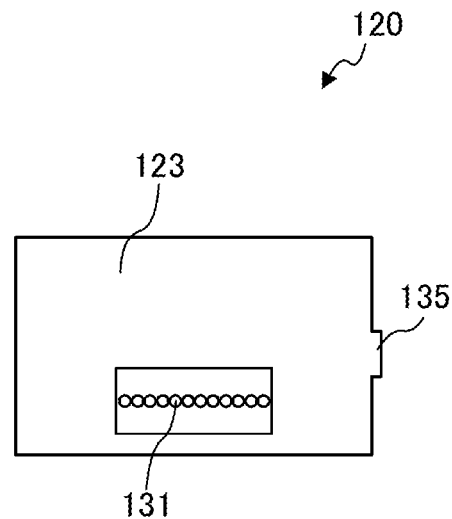
Figure 3C:
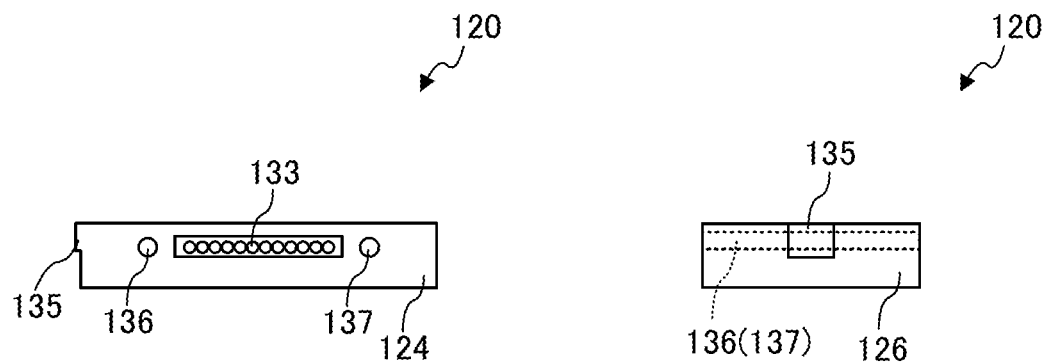
Figure 3D:
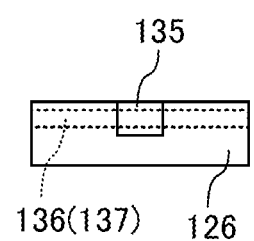

FIG. 2 and FIG. 3A to FIG. 3D illustrate a configuration of optical receptacle 120 according to the present embodiment. FIG. 2 is a perspective view of optical receptacle 120. FIG. 3A is a plan view, FIG. 3B is a bottom view, FIG. 3C is a front view, and FIG. 3D is a left side view.

As illustrated in FIG. 2 and FIG. 3A to FIG. 3D, optical receptacle 120 is a member having a substantially cuboid shape. Optical receptacle 120 has light transmissivity, and emits light emitted by light emitting element 114 toward an end surface of optical transmission member 116. Optical receptacle 120 includes optical receptacle main body 121, a plurality of first optical surfaces (incidence surface) 131, a plurality of second optical surfaces (emission surface) 133, first recess 134 having inclined surface (reflecting surface) 132, gate part 135, first through hole 136, second through hole 137 and second recess 138. Optical receptacle 120 is manufactured by injection molding.

Optical receptacle main body 121 is a member having a substantially cuboid shape made of a light transmissive resin material, and has top surface 122 and bottom surface 123 opposite to each other, first side surface 124 and second side surface 125 opposite to each other, and third side surface 126 and fourth side surface 127 opposite to each other. Optical receptacle main body 121 is formed of a material having light transmissivity for light of wavelengths used for optical communications. Examples of the material having such light transmissivity include transparent resins such as polyetherimide (PEI) and cyclic olefin resin. As illustrated in FIG. 2, in the following description, the direction connecting first side surface 124 and second side surface 125 is also referred to as "X direction," the direction connecting third side surface 126 and fourth side surface 127 is also referred to as "Y direction," and the direction connecting top surface 122 and bottom surface 123 is also referred to as "Z direction."

First optical surface 131 is an incidence surface which refracts laser light emitted from light emitting element 114 and allows the laser light to enter optical receptacle 120. A plurality of first optical surfaces 131 corresponding to a plurality of light emitting elements 114 are arranged on bottom surface 123 of optical receptacle main body 121. The shape of first optical surface 131 is not limited. In the present embodiment, the shape of first optical surface 131 is a convex lens surface protruding toward light emitting element 114. In addition, first optical surface 131 has a circular shape in a plan view. The light incident on first optical surface (incidence surface) 131 advances toward inclined surface (reflecting surface) 132. It is to be noted that when light emitting elements 114 are arranged in two or more lines, the number of the lines of first optical surfaces 131 is identical to that of light emitting elements 114.

Inclined surface 132 is a reflecting surface which reflects the light incident on first optical surface 131 toward second optical surface 133. Inclined surface 132 is a part of first recess 134 described later. Inclined surface 132 is tilted such that the distance to optical transmission member 116 decreases from bottom surface 123 side toward top surface 122 side of optical receptacle 120. The inclination angle of inclined surface 132 to the optical axis of the light emitted from light emitting element 114 is not limited. Preferably, the inclination angle of inclined surface 132 is 45 degrees to the optical axis of the light incident on first optical surface 131. The shape of inclined surface 132 is not limited. In the present embodiment, the shape of inclined surface 132 is a plane. The light incident on first optical surface 131 is incident on inclined surface 132 at an incident angle greater than the critical angle. Inclined surface 132 totally reflects the incident light toward second optical surface 133. That is, light having a predetermined light flux diameter is incident on inclined surface (reflecting surface) 132, and light having a predetermined light flux diameter is emitted toward second optical surface (emission surface) 133.

Second optical surface 133 is an emission surface which emits the light totally reflected by inclined surface (reflecting surface) 132 toward an end surface of optical transmission member 116. A plurality of second optical surfaces 133 corresponding to a plurality of optical transmission members 116 are arranged on first side surface (front surface) 124 of optical receptacle main body 121. The shape of second optical surface 133 is not limited. In the present embodiment, the shape of second optical surface 133 is a convex lens surface protruding toward an end surface of optical transmission member 116. With this configuration, the light having a predetermined light flux diameter reflected by inclined surface 132 can be efficiently connected to an end surface of optical transmission member 116. It is to be noted that, when optical transmission members 116 are arranged in two or more lines, the number of the lines of second optical surfaces 133 is identical to that of optical transmission members 116.

First recess 134 includes the above-described inclined surface 132. First recess 134 opens at top surface 122 of optical receptacle main body 121. In addition, first through hole 136 and second through hole 137 do not open at the internal surface of first recess 134. Further, first recess 134 does not open at third side surface 126 or fourth side surface 127. That is, the opening part of first recess 134 opens only at top surface 122. As long as first recess 134 includes inclined surface 132 and satisfies the above-described conditions, the shape of first recess 134 is not limited. In the present embodiment, first recess 134 has a triangular prism shape with a right triangular bottom surface.

First through hole 136 is disposed between first recess 134 and third side surface 126. In addition, first through hole 136 is extended in the light axis direction of the light which advances between second optical surface 133 and an end surface of optical transmission member 116. First through hole 136 opens at first side surface 124 and second side surface 125.

Second through hole 137 is disposed between first recess 134 and fourth side surface 127. In addition, second through hole 137 is extended in the light axis direction of the light which advances between second optical surface 133 and an end surface of optical transmission member 116. Second through hole 137 opens at first side surface 124 and second side surface 125.

First through hole 136 and second through hole 137 are not limited as long as first through hole 136 and second through hole 137 are formed in shapes complementary to a pair of guide pins of a connector attached to optical transmission member 116, and formed at positions corresponding to the pair of guide pins. In the present embodiment, first through hole 136 and second through hole 137 are formed in a columnar shape. In addition, first through hole 136 and second through hole 137 are disposed to sandwich second optical surfaces 133 in the longitudinal direction thereof.

Gate part 135 is a part disposed on third side surface 126, and corresponds to an inlet of melted resin for injection molding of optical receptacle 120. Gate part 135 is disposed at a center portion of third side surface 126 in the X direction. In addition, the upper end of gate part 135 is located at the upper end of third side surface 126 in the Z direction. Further, the lower end of gate part 135 is disposed on bottom surface 123 side relative to the lower end of first through hole 136 in the Z direction.

Second recess 138 opens at top surface 122 of optical receptacle main body 121, and is disposed between first recess 134 and third side surface 126. Second recess 138 serves as a barrier against the melted resin flowing from gate part 135 in injection molding of optical receptacle 120. Second recess 138 may be communicated with first recess 134 or may not be communicated with first recess 134. In the present embodiment, second recess 138 is communicated with first recess 134. The shape of second recess 138 is not limited as long as second recess 138 is formed to surround first through hole 136 in the Y-Z cross-section. In the present embodiment, second recess 138 has a cuboid shape. The length of second recess 138 in the Y direction is greater than the diameter of first through hole 136. In addition, the length of second recess 138 in the Z direction is greater than the diameter of the first through hole. It is to be noted that the length of second recess 138 in the X direction is not limited. In the present embodiment, the length of second recess 138 in the X direction is smaller than the length of first recess 134 in the X direction. The entirety of first through hole 136 opens at a first internal surface of second recess 138 on first side surface 124 side and a third internal surface of second recess 138 on third side surface 126 side. In addition, the portion of second recess 138 on the most second side surface 125 side is located on first side surface 124 side relative to the portion of gate part 135 on the most first side surface 124 side. That is, in lateral view of optical receptacle 120, second recess 138 and gate part 135 are separated from each other. In the above-mentioned manner, second recess 138 is disposed such that second recess 138 serves as a barrier when melted resin moves from a position corresponding to the gate part to a position corresponding to second optical surface 133 in injection molding.

(Simulations)

Figure 4:
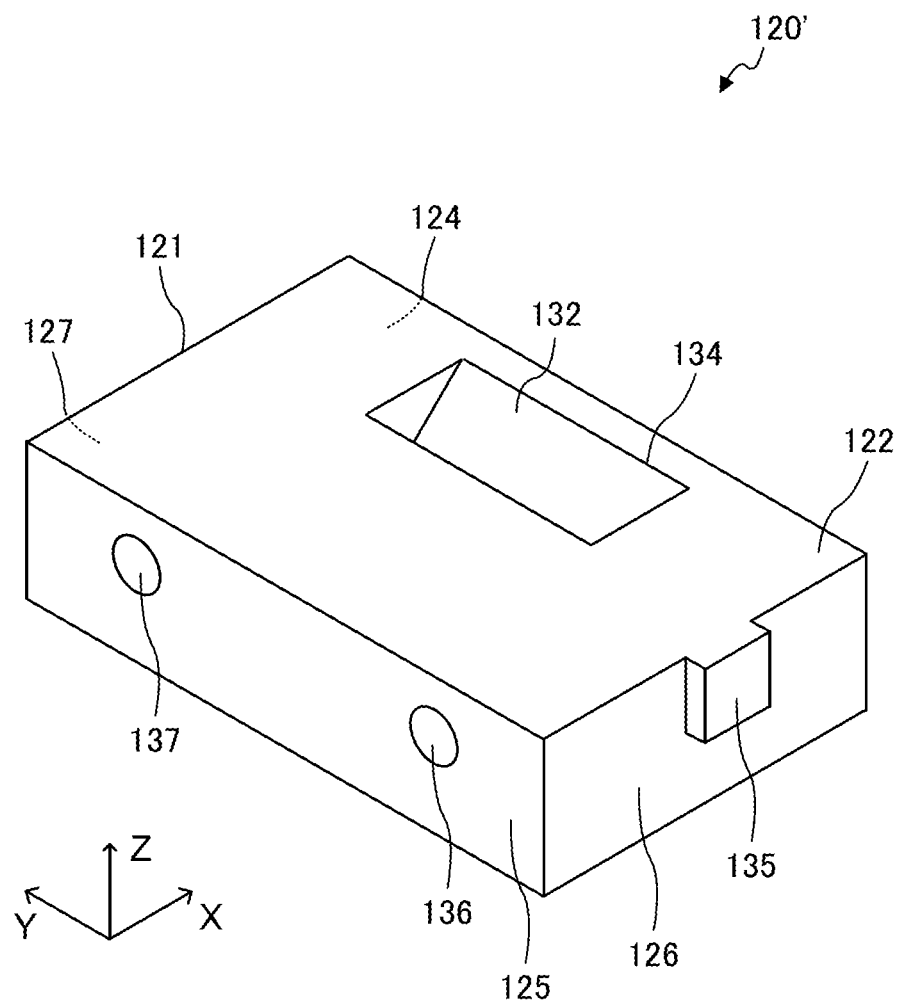
FIG. 4 is a perspective view of an optical receptacle for comparison.

Next, in the process of manufacturing optical receptacle 120 according to the present embodiment by injection molding, positions where weld lines are formed when filling the cavity with melted resin were simulated. It is to be noted that, for comparison, the same simulation was conducted using optical receptacle 120' (hereinafter referred to also as "optical receptacle for comparison") provided with no second recess 138 (see FIG. 4).

In the simulations, optical receptacle 120 of 8.0×5.0×2.1 (mm) was assumed. In addition, first recess 134 was 3.5× 1.5×1.5 (deepest part) (mm), second recess 138 was 1.7× 0.8×1.2 (mm), and the diameter of first through hole 136 and second through hole 137 was 0.7 (mm).

Figure 5A:
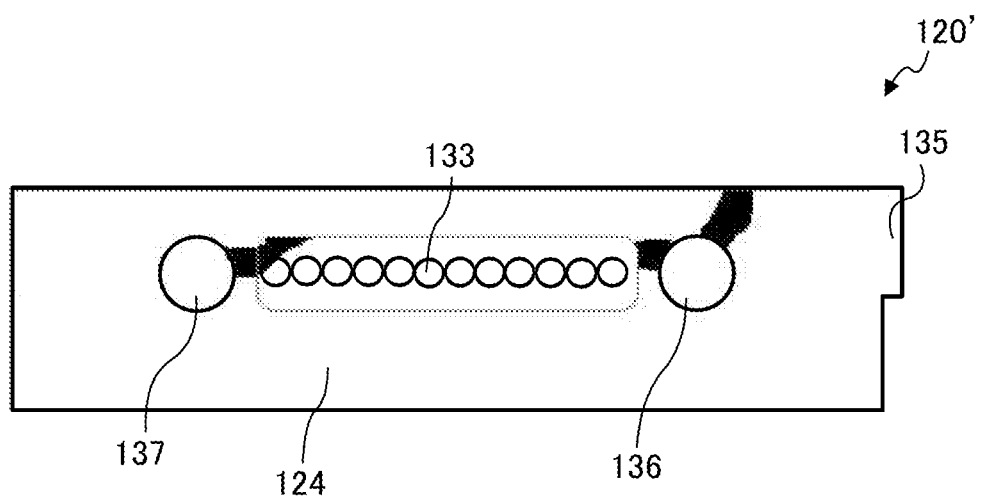
FIGS. 5A and 5B show a simulation using the optical receptacle for comparison.
Figure 5B:
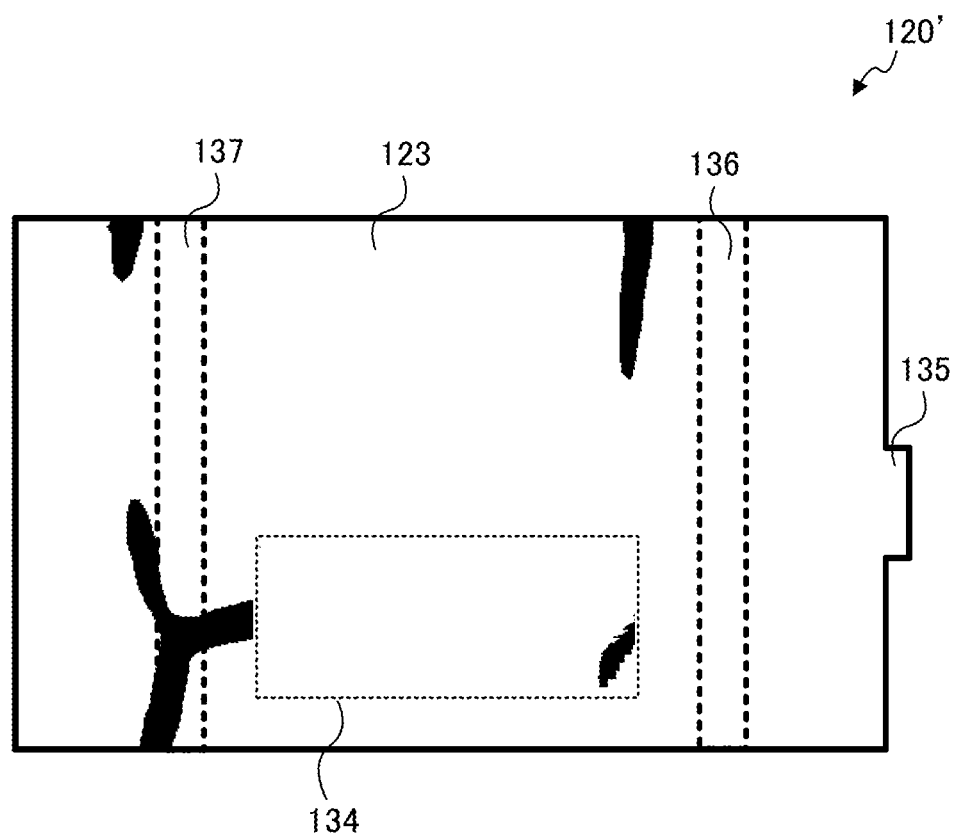
Figure 6A:
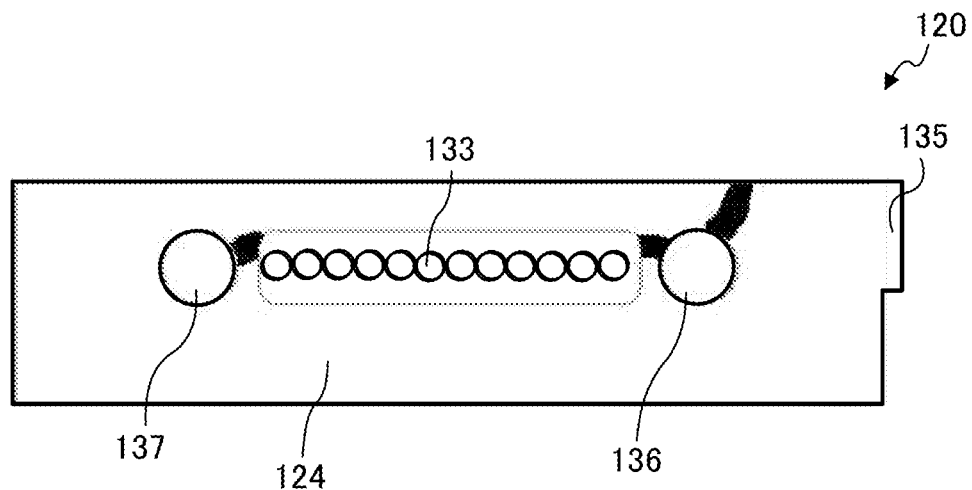
FIGS. 6A and 6B show a simulation using the optical receptacle according to the embodiment.
Figure 6B:
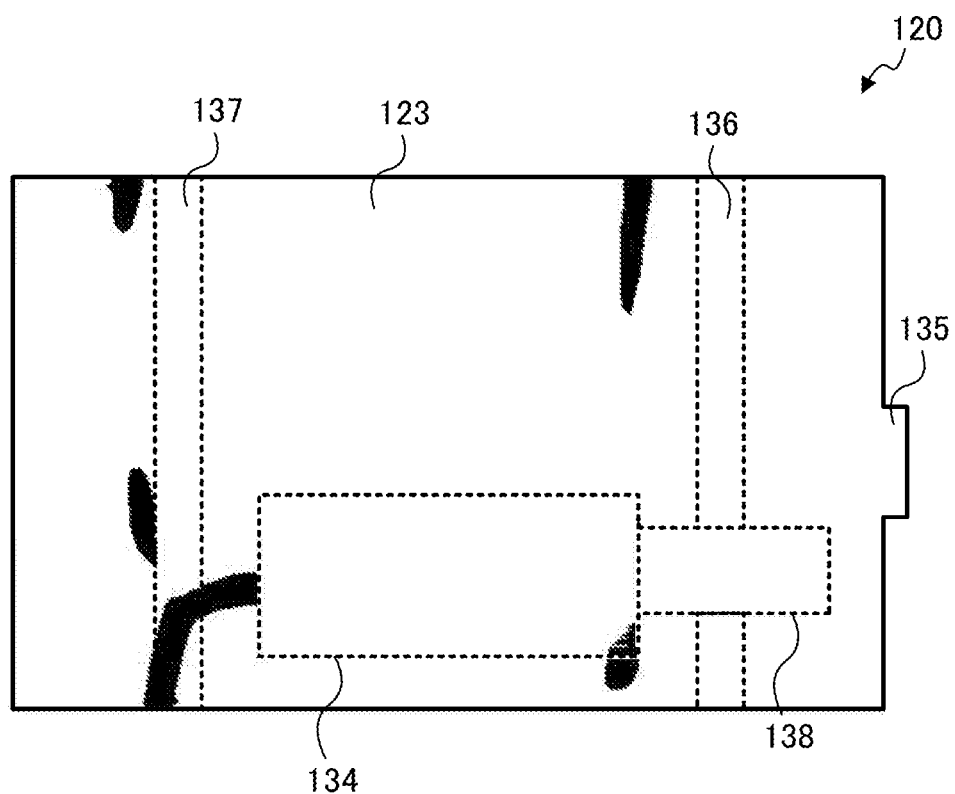

FIG. 5A to FIG. 6B show the simulations in the optical receptacles. FIG. 5A shows the simulation of optical receptacle for comparison 120' in front view, and FIG. 5B shows the simulation of optical receptacle for comparison 120' in plan view. FIG. 6A shows the simulation of optical receptacle 120 according to the present embodiment in front view, and FIG. 6B shows the simulation of optical receptacle 120 according to the present embodiment in plan view. In FIG. 5A to FIG. 6B, the portions colored with black indicate the weld line.

As illustrated in FIG. 5A and FIG. 5B, in optical receptacle for comparison 120' provided with no second recess 138, weld lines were formed at portions of light paths in second optical surface 133 and inclined surface 132. One possible reason for this is that the melted resin provided from gate part 135 advanced in first through hole 136 and second through hole 137 from the vertical direction, and the cavity was filled with the melted resin.

On the other hand, in optical receptacle 120 according to the present embodiment having second recess 138, no weld line was formed at portions of light paths in second optical surface 133 and inclined surface 132 as illustrated in FIG. 6A and FIG. 6B. One possible reason for this is that, in the injection molding, the portion corresponding to second recess 138 served as a barrier against the melted resin in the cavity, and the position where the weld line is formed was shifted.

Figure 7:
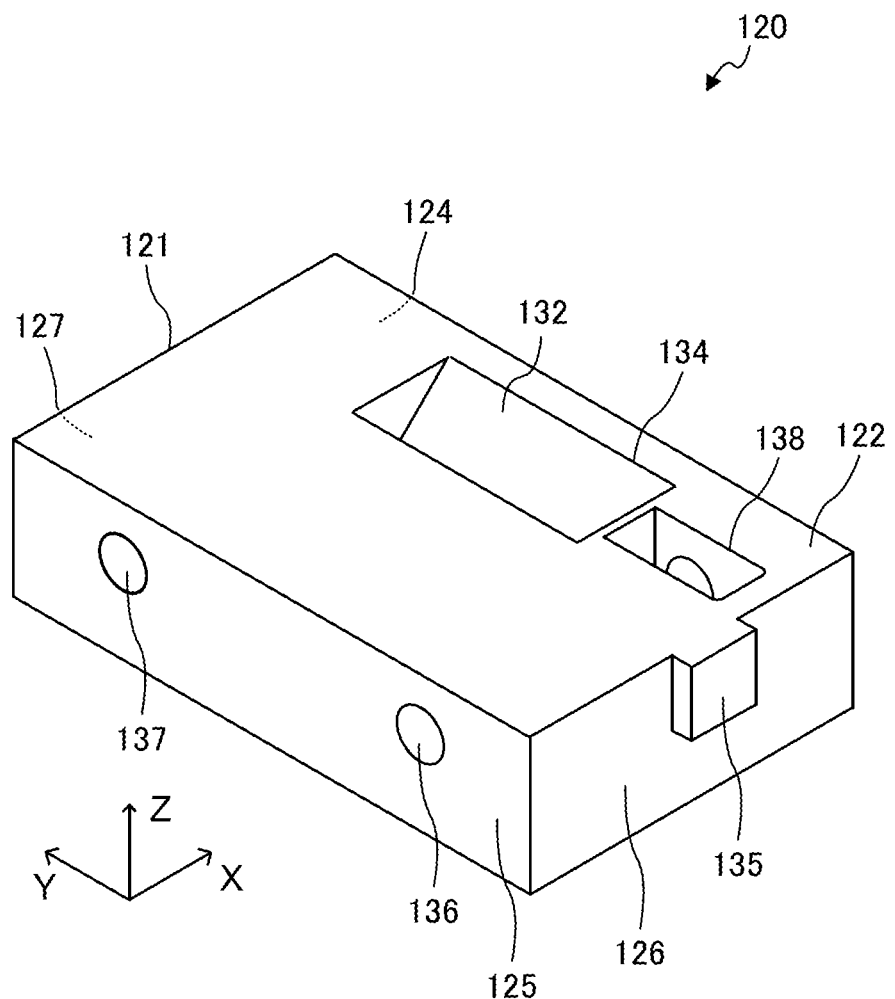
FIG. 7 is a perspective view of an optical receptacle according to a modification of the embodiment.
Figure 8A:
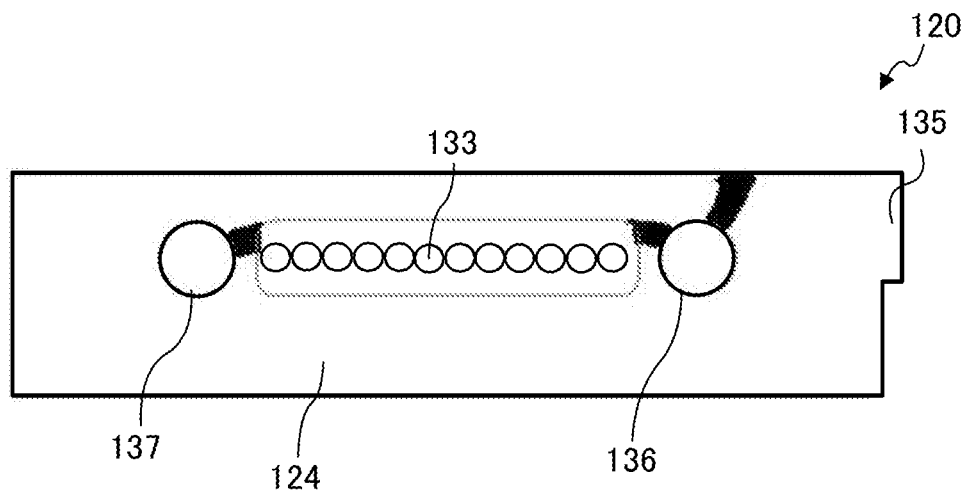
FIGS. 8A and 8B show a simulation using the optical receptacle according to the modification of the embodiment.
Figure 8B:
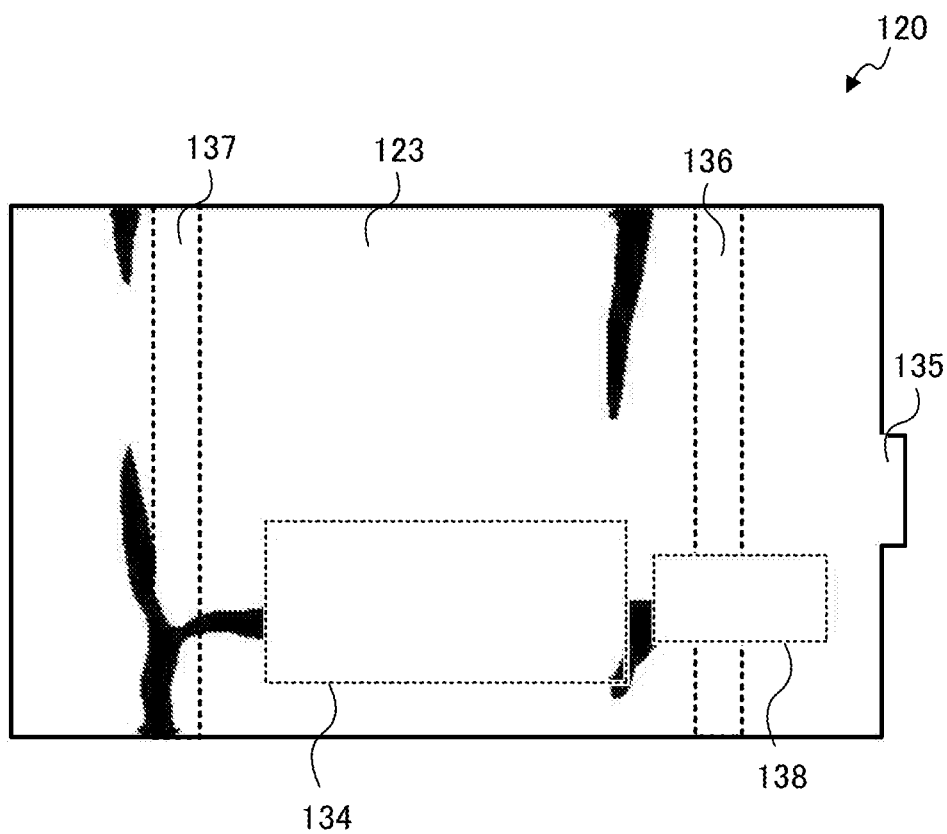

It is to be noted that, as illustrated in FIG. 7, first recess 134 and second recess 138 may be separated from each other. In this case, as illustrated in FIG. 8A and FIG. 8B, no weld line was formed at portions of light paths in second optical surface 133 and inclined surface 132.

While first optical surface 131 and second optical surface 133 are convex lens surfaces in optical receptacle 120 according to the embodiments, first optical surface 131 and second optical surface 133 may be planes. To be more specific, only first optical surface 131 may be a plane, or only second optical surface 133 may be a plane. In the case where first optical surface 131 is formed in a plane, inclined surface 132 is formed to function as a recessed surface mirror, for example. In addition, in the case where the light immediately before reaching second optical surface 133 is effectively converged by first optical surface 131, inclined surface 132 and the like, second optical surface 133 may be formed in a plane.

In addition, optical receptacle 120 according to the embodiments may be used for a reception optical module. In this case, the reception optical module includes a plurality of photodetectors for receiving light as a photoelectric conversion device in place of a plurality of light emitting elements 114. The photodetectors are disposed at positions of respective light emitting elements. In the reception optical module, second optical surface 133 serves as the incidence surface, and first optical surface 131 serves as the emission surface. Light emitted from an end surface of optical transmission member 116 enters the optical receptacle from second optical surface 133. Then, the light having entered the optical receptacle is reflected by inclined surface 132 and emitted from first optical surface 131 toward the photodetector.

This application is entitled to and claims the benefit of Japanese Patent Application No. 2014-056512 filed on Mar. 19, 2014, the disclosure each of which including the specification, drawings and abstract is incorporated herein by reference in its entirety.

INDUSTRIAL APPLICABILITY

The optical receptacle and the optical module according to the embodiment of the present invention are suitable for optical communications using an optical transmission member.

REFERENCE SIGNS LIST

100 Optical module
110 Photoelectric conversion device
112 Substrate
114 Light emitting element
116 Optical transmission member
120, 120' Optical receptacle
121 Optical receptacle main body
122 Top surface
123 Bottom surface
124 First side surface
125 Second side surface
126 Third side surface
127 Fourth side surface
131 First optical surface
132 Inclined surface
133 Second optical surface
134 First recess
135 Gate part
136 First through hole
137 Second through hole
138 Second recess

The invention claimed is:

1. An optical receptacle formed by injection molding, and disposed between a plurality of photoelectric conversion devices arranged in line and a plurality of optical transmission members arranged in line, the optical receptacle being configured to optically connect the photoelectric conversion devices and respective end surfaces of the optical transmission members, the optical receptacle comprising:
   an optical receptacle main body made of a light transmissive resin material, and having a substantially cuboid shape with a top surface and a bottom surface opposite to each other, a first side surface and a second side surface opposite to each other and a third side surface and a fourth side surface opposite to each other;
   a plurality of first optical surfaces arranged on the bottom surface of the optical receptacle main body to correspond to the photoelectric conversion devices, the first optical surfaces being configured to allow light emitted from the photoelectric conversion devices to enter the optical receptacle main body, or emit light travelling in the optical receptacle main body towards the respective end surfaces of the photoelectric conversion devices;
   a plurality of second optical surfaces arranged on the first side surface of the optical receptacle main body to correspond to the optical transmission members, the second optical surfaces being configured to emit light incident on the first optical surfaces towards respective end surfaces of the optical transmission members, or allow light from the optical transmission members to enter the optical receptacle main body;
   a first recess opening at the top surface of the optical receptacle main body and including an inclined surface configured to reflect light incident on a first optical surface towards a second optical surface, or reflect light incident on the second optical surface towards the first optical surface;
   a gate part disposed on the third side surface;
   a first through hole disposed between the first recess opening and the third side surface, and extending in a light axis direction of light advancing between the second optical surface and an end surface of an optical transmission member, the first through hole opening at the first side surface and the second side surface;
   a second through hole disposed between the first recess opening and the fourth side surface, and extending in the light axis direction of light advancing between the second optical surface and the end surface of the optical transmission member, the second through hole opening at the first side surface and the second side surface; and a second recess opening at the top surface of the optical receptacle main body, and disposed between the first recess opening and the third side surface, wherein:

a portion closest to the second side surface in the second recess opening is located on the first side surface side relative to a portion closest to the first side surface in the gate part, and the first through hole opens at a surface of the second recess opening on the first side surface side and a surface of the second recess opening on the second side surface side.

2. An optical module comprising:

a substrate on which the photoelectric conversion devices are arranged at constant intervals; and the optical receptacle main body according to claim 1 disposed on the substrate.

\* \* \* \* \*